(12) United States Patent
Moessler et al.

(10) Patent No.: US 9,116,875 B2
(45) Date of Patent: Aug. 25, 2015

(54) TEST CIRCUIT AND METHOD FOR PROCESSING A TEST ROUTINE

(71) Applicant: Infineon Technologies AG, Neubiberg (DE)

(72) Inventors: Bernhard Moessler, Stuben (AT); Achim Osterloh, Egg am See (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 211 days.

(21) Appl. No.: 13/709,107

(22) Filed: Dec. 10, 2012

(65) Prior Publication Data

US 2014/0164832 A1   Jun. 12, 2014

(51) Int. Cl.
| | |
|---|---|
| *G06F 11/00* | (2006.01) |
| *G06F 11/27* | (2006.01) |
| *G06F 11/263* | (2006.01) |
| *G06F 11/22* | (2006.01) |
| *G06F 11/24* | (2006.01) |
| *G01R 31/319* | (2006.01) |

(52) U.S. Cl.
CPC .......... *G06F 11/27* (2013.01); *G01R 31/31901* (2013.01); *G06F 11/2273* (2013.01); *G06F 11/24* (2013.01); *G06F 11/263* (2013.01); *G01R 31/31924* (2013.01)

(58) Field of Classification Search
CPC ............ G06F 11/2294; G06F 11/2236; G06F 11/2273; G06F 11/0748; G06F 11/261; G06F 11/079; G06F 11/263; G06F 11/2733; G06F 11/277; G06F 11/24; G06F 11/26; G06F 11/27; G06F 11/28; G01R 31/319; G01R 31/31901; G01R 31/31905; G01R 31/31908; G01R 31/31912; G01R 31/3275; G01R 31/31924

USPC .......................................................... 714/27
See application file for complete search history.

(56) References Cited

U.S. PATENT DOCUMENTS

| | | | | |
|---|---|---|---|---|
| 4,768,195 | A | * | 8/1988 | Stoner et al. ................... 714/736 |
| 4,907,230 | A | * | 3/1990 | Heller et al. ................... 714/724 |
| 2003/0155941 | A1 | * | 8/2003 | Byun et al. ..................... 324/765 |

OTHER PUBLICATIONS

Tanenbaum, Andrew S. "1.4 Hardware, Software, and Multilevel Machines." In Structured Computer Organization, pp. 11-13. 3rd ed. Prentice-Hall, 1990.*

* cited by examiner

*Primary Examiner* — Bryce Bonzo
*Assistant Examiner* — Anthony J Amoroso

(57) ABSTRACT

According to one embodiment, a test circuit is provided comprising a tester configured to perform a test routine comprising a plurality of test commands for testing an electronic circuit, wherein the tester comprises a checker configured to, if a test command of the plurality of test commands is to be performed, check, whether there is currently a state in which performing the test command could lead to a damage of the electronic circuit and configured to, in case it determines that there is currently a state in which performing the test routine could lead to a damage of the electronic circuit, output a signal indicating that performing the test routine could lead to a damage of the electronic circuit.

18 Claims, 15 Drawing Sheets

```
/*****************************************************************************
/* Report generated by HSC_v200.xla version 2.00a - Module: UDB_check         1000
/*
/* generated on : 30.05.2012 at 12:36:31
/* created by   : Moessler Bernhard (IFAT DC ATV TE VI)                       1003
/*                                                                            1002
/* TESTPROGRAM INFORMATION:                1004
/* TestProgram      : \\testeng\testeng\PROFET\Moessler_Bernhard\TestPrograms\smart6\Flex\L8300\rev1.19\BTS50xx_119_HSC.xls
/* CurrentCharmap   : charmap_BE
/* CurrentJob       : BTS5010-2LAA-CT
/* Revision         : 1.19                 1005
/* ExistingSites    : 4
/* Run on Sites     : 0123
/* ExecutionCount   : 1
/* TestMode         : runModeDebug
/*                                         1006
/* COMPUTER INFORMATION:
/* ComputerName     : VIHNR9ELIN8
/* OperatingSystem  : Unknownservice pack 1
/* PhysicalMemory   : 2097151 KB RAM
/* ProcessorSpeed   : ~2591 Mhz
/* ProcessorType    : GenuineIntel x86 Family 6 Model 42 Stepping 7
/* UserName         : moessler
/* ComputerName     : VIHNR9ELIN8
/*                                         1007
/* IGXL INFORMATION:
/* SoftwareVersion  : 5.10.55_flx (P7)
/* SoftwareBuild    : 10.25.11.23.34
/* TesterType       : IntegraFlex
/*
/*****************************************************************************
```

FIG 11

```
/****************************************
 ****  Module Configuration
 ****************************************
BreakOnHazardousState : False
```

| Relais | SwitchTime[ms] | Switchcount | checkopen | checkclose | AssignedDC90's |
|---|---|---|---|---|---|
| K2 | N/A | 4 | N/A | N/A | |
| K3 | N/A | 4 | N/A | N/A | |
| K5 | N/A | 4 | N/A | N/A | |
| K6 | N/A | 0 | N/A | N/A | |
| K10 | N/A | 9 | N/A | N/A | |
| K11 | N/A | 6 | N/A | N/A | |
| K12 | N/A | 0 | N/A | N/A | |
| K13 | N/A | 8 | N/A | N/A | |
| K14 | N/A | 2 | N/A | N/A | |
| K17 | N/A | 2 | N/A | N/A | |
| K18 | N/A | 2 | N/A | N/A | |
| K19 | N/A | 0 | N/A | N/A | |
| K21 | N/A | 0 | N/A | N/A | |
| K23A | 10.000 | 16 | Yes | Yes | DC90_1_OUT0ah, DC90_2_GNDbh, DC90_3_OUT0ah, DC90_4_O |
| K23B | 10.000 | 16 | Yes | Yes | DC90_1_OUT0ah, DC90_2_GNDbh, DC90_3_OUT0ah, DC90_4_O |
| K24A | 10.000 | 2 | Yes | Yes | DC90_1_GNDbh, DC90_1_OUT0ah, DC90_2_GNDbh, DC90_2_O |
| K24B | 10.000 | 2 | Yes | Yes | DC90_1_GNDbh, DC90_1_OUT0ah, DC90_2_GNDbh, DC90_2_O |
| K25 | N/A | 2 | N/A | N/A | |
| K26A | 10.000 | 16 | Yes | Yes | DC90_1_GNDbh, DC90_2_OUT1ah, DC90_3_OUT1bh, DC90_4_O |
| K26B | 10.000 | 16 | Yes | Yes | DC90_1_GNDbh, DC90_2_OUT1ah, DC90_3_OUT1bh, DC90_4_O |
| K27A | 10.000 | 16 | Yes | Yes | DC90_1_GNDbh, DC90_2_OUT0ah, DC90_3_OUT0ah, DC90_4_O |
| K27B | 10.000 | 2 | Yes | Yes | DC90_1_GNDbh, DC90_1_OUT0ah, DC90_2_GNDbh, DC90_2_O |
| K28A | 10.000 | 2 | Yes | Yes | DC90_1_GNDbh, DC90_1_OUT0ah, DC90_2_GNDbh, DC90_2_O |
| K28B | 10.000 | 2 | Yes | Yes | DC90_1_GNDbh, DC90_1_OUT0ah, DC90_2_GNDbh, DC90_2_O |
| K29A | 10.000 | 2 | Yes | Yes | DC90_1_GNDbh, DC90_2_GNDbh, DC90_2_O |
| K29B | 10.000 | 2 | Yes | Yes | DC90_1_GNDbh, DC90_2_GNDbh, DC90_2_O |
| K30 | N/A | 0 | N/A | N/A | |
| K31 | N/A | 0 | N/A | N/A | |
| K32A | 10.000 | 2 | Yes | Yes | DC90_1_vsa1, DC90_2_vsa1, DC90_3_vsa1, DC90_4_vsa |
| K32B | 10.000 | 2 | Yes | Yes | DC90_1_vsa1, DC90_2_vsa1, DC90_3_vsa1, DC90_4_vsa |
| K33A | 10.000 | 2 | Yes | Yes | DC90_5_vsb1, DC90_6_vsb1, DC90_7_vsb1, DC90_8_vsb |
| K33B | 10.000 | 2 | Yes | Yes | DC90_5_vsb1, DC90_6_vsb1, DC90_7_vsb1, DC90_8_vsb |
| K34 | 10.000 | 4 | Yes | Yes | DC90_2_GNDbh |
| K35 | 10.000 | 4 | Yes | Yes | |
| K36 | N/A | 4 | N/A | N/A | |
| K37 | N/A | 4 | N/A | N/A | |

```
/*********************************************************************************
/*   Reported Occurences - if no record found, no occurence detected
/*********************************************************************************
######################################################----1201
Kelvin -> UDB SettleTime violation have been found   ######
##################################################
Pins: DC90_1_GNDbh, DC90_2_GNDbh K23A    -> SettleTime: 10.000ms    ActTime(Absolute): 8.014ms    ActTime(Corrected): 7.145ms
    K23B    -> SettleTime: 10.000ms    ActTime(Absolute): 8.012ms    ActTime(Corrected): 7.143ms
    K26A    -> SettleTime: 10.000ms    ActTime(Absolute): 8.010ms    ActTime(Corrected): 7.141ms
    K26B    -> SettleTime: 10.000ms    ActTime(Absolute): 8.007ms    ActTime(Corrected): 7.138ms
                                                                                                    1202
##############################################################################
Kelvin -> UDB SettleTime violation have been found (can be ignored if every DCVI Connect Statement is inside a Settlewait structure)  ######
##############################################################################
Pins: DC90_3_OUT0ah, DC90_4_OUT1ah K23A    -> SettleTime: 10.000ms    ActTime(Absolute): 12.776ms    ActTime(Corrected): 8.380ms
    K23B    -> SettleTime: 10.000ms    ActTime(Absolute): 12.774ms    ActTime(Corrected): 8.378ms
    K26A    -> SettleTime: 10.000ms    ActTime(Absolute): 12.772ms    ActTime(Corrected): 8.376ms
    K26B    -> SettleTime: 10.000ms    ActTime(Absolute): 12.769ms    ActTime(Corrected): 8.373ms  1203

**********************************************************************
******  Kelvin -> Switching Relais: K10, K14, K23, K26, K34, K35 with disconnected DC90-LocalKelvin-Relay  ******
**********************************************************************
-------------------------------------------------------------------
K23A   = open:
    DC90_2_GNDbh    @ Site 0    ->    MUXB-HiForce    connected
-------------------------------------------------------------------
K23B   = open:
    DC90_2_GNDbh    @ Site 0    ->    MUXB-HiForce    connected
-------------------------------------------------------------------
K26A   = open:
    DC90_1_GNDbh    @ Site 0    ->    MUXB-HiForce    connected
    DC90_3_OUT1bh   @ Site 0    ->    MUXB-HiForce    connected
    DC90_4_OUT1ah   @ Site 0    ->    MUXB-HiForce    connected
                                                                                                    1204
##############################################################################
Timing -> UDB SettleTime violation have been found (can be ignored if every DCVI Connect Statement is inside a Settlewait structure)  ######
##############################################################################
Pins: IS_dc, vs_dc, DC90_3_OUT0ah, DC90_4_OUT1ah K23A    -> SettleTime: 10.000ms    ActTime(Absolute): 10.010ms    ActTime(Corrected): 9.896ms
    K23B    -> SettleTime: 10.000ms    ActTime(Absolute): 10.008ms    ActTime(Corrected): 9.894ms
    K26A    -> SettleTime: 10.000ms    ActTime(Absolute): 10.006ms    ActTime(Corrected): 9.891ms
    K26B    -> SettleTime: 10.000ms    ActTime(Absolute): 10.004ms    ActTime(Corrected): 9.890ms /*********************************************************************************
/*   End of Report
/*********************************************************************************
```

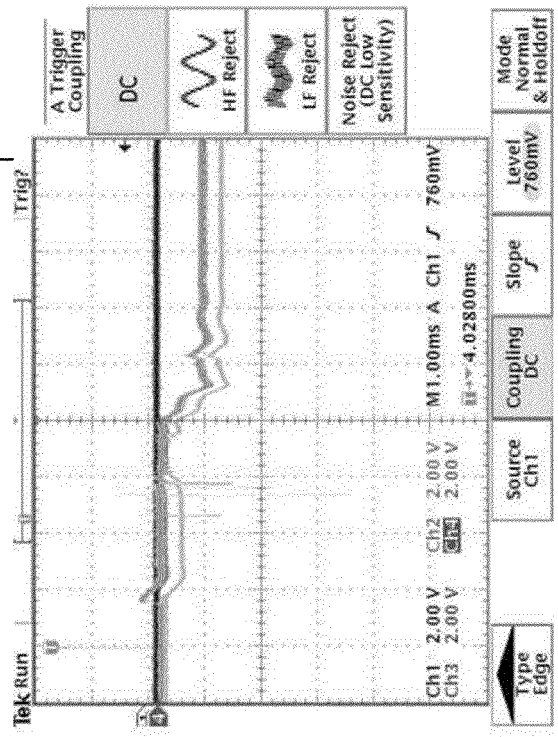
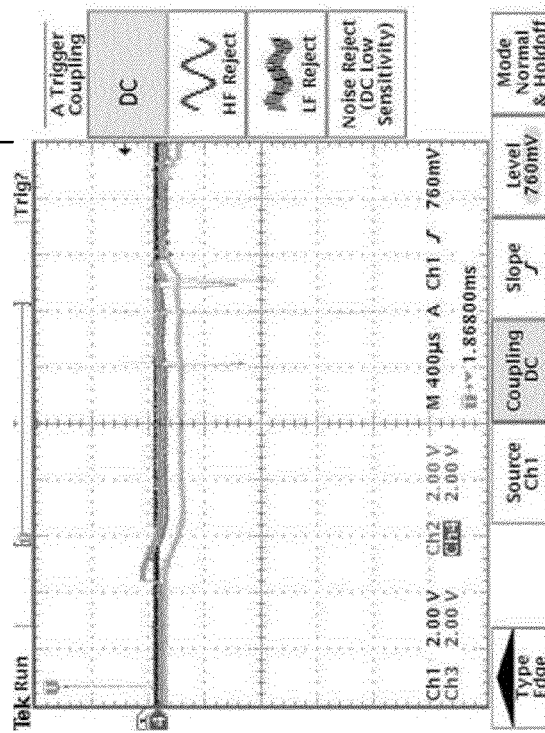
FIG 14

TEST CIRCUIT AND METHOD FOR PROCESSING A TEST ROUTINE

TECHNICAL FIELD

The present disclosure relates to test circuits and methods for processing test routines.

BACKGROUND

Electronic circuits are typically tested after manufacture before delivering them to the customer. Since in such a testing procedure, electric test signals are typically applied to the electronic circuit to be tested there is a risk that if the test procedure is not carried out properly, e.g. there is a voltage peak in a test signal, that the electronic circuit gets damaged in testing. It is desirable to avoid this.

SUMMARY

According to one embodiment, a test circuit is provided including a tester configured to perform a test routine including a plurality of test commands for testing an electronic circuit, wherein the tester includes a checker configured to, if a test command of the plurality of test commands is to be performed, check, whether there is currently a state in which performing the test command could lead to a damage of the electronic circuit and configured to, in case it determines that there is currently a state in which performing the test routine could lead to a damage of the electronic circuit, output a signal indicating that performing the test routine could lead to a damage of the electronic circuit.

According to a further embodiment, a method for processing a test routine including a plurality of test commands for testing an electronic circuit is provided, the method including determining, for each test command of the plurality of test commands, whether the test command fulfills a predetermined criterion and complementing each test command of the plurality of test commands that fulfills the predetermined criterion with a check command which checks whether performing the test command could lead to a damage of the electronic circuit and, in case it determines that there is currently a state in which performing the test routine could lead to a damage of the electronic circuit, outputs a signal indicating that performing the test routine could lead to a damage of the electronic circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 9 shows an option screen.
FIG. 10 shows a report header.
FIG. 11 shows a module configuration section.
FIG. 12 shows an occurrences section.
FIG. 14 shows oscilloscope outputs.

DESCRIPTION

Figure 1:
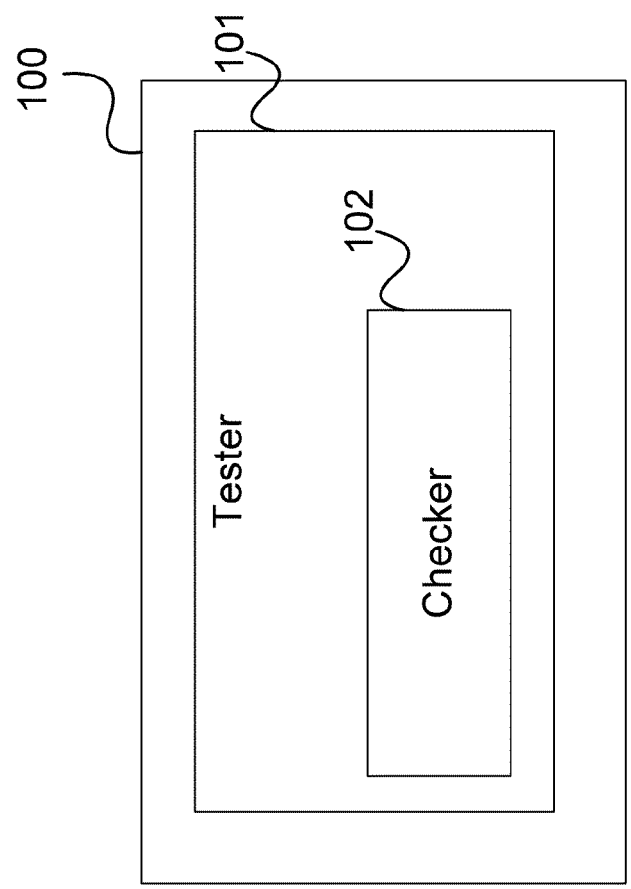
FIG. 1 shows a test circuit.

The following detailed description refers to the accompanying drawings that show, by way of illustration, specific details and aspects of this disclosure in which the invention may be practiced. These aspects of this disclosure are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

According to one embodiment, parts of a test routine (also referred to as test program) for testing an electronic circuit that lead to undesirable hardware conditions (e.g. due to programming errors) are automatically located. Such conditions may occur in combination with the hardware used by the test engineer (e.g. the Device Interface Board (DIB) used). Instead of trusting that the author of the test routine applies sufficient programming skills and programming guidelines (if available) this allows a verification of the test routine in terms of undesirable hardware conditions (e.g. conditions (potentially) causing damage to the circuit to be tested) without, for example, manually checking test signals by means of an oscilloscope with high effort.

A test routine that may be processed or used in this way is for example a test routine written in a test program development programming language like Teradyne's IGXL. For example, according to one embodiment, an overlay-technique based on the hardware interface of the IGXL programming language is used. This allows introducing checkpoints before the initiation of test commands (e.g. test commands whose execution might lead to a damage of the circuit to be tested, e.g. depending on the hardware state in which they are initiated) and/or also after the execution of the test commands This approach also allows extending the check process for increasing the security (in terms of avoiding circuit damage) of the test routine, e.g. by introducing additional checkpoints and check methods.

For example, according to one embodiment, a checker (e.g. a checking program) checks program code of a test routine in terms of possible hazardous conditions (e.g. for states in which a hazardous condition may occur in case a certain test command is executed) which are for example caused by switching a relay on a Device Interface Board (DIB) and in which there is for example an open loop condition of a power instrument (e.g. a Flex DC90). The power instrument may for example be associated with one or more relays of the DIB, namely that or those relays via which it is connected to the electronic circuit to be tested (device under test (DUT)).

Hardware modeling allows checking the test routine in combination with the test hardware (e.g. the DIB).

In case a hazardous condition is found or an imminent hazardous condition is found, e.g. a call to a test command is found in the test routine which would be executed during a hardware state that would lead to a hazardous condition, i.e. a condition in which the device under test might be damaged, i.e. there is a risk that the device under test is damaged, e.g. because of an overvoltage, the test routine may be stopped (e.g. the execution of the test command may be stalled) at the exact position of the (imminent) hazardous condition such that the part of the test routine that might be problematic can be easily located.

The checker may be executed online (i.e. when the test routine actually controls the test hardware) and offline (e.g. by means of a simulator). In online mode (i.e. when executed online) the checker may for example generate synchronization signals which may be used as trigger signals for an oscilloscope. The checker may for example generate a report indicating the risk of the test routine (e.g. the number of hazardous conditions the test program may cause).

A test circuit according to an embodiment is described in the following with reference to FIG. 1.

FIG. 1 shows a test circuit 100 according to an embodiment.

The test circuit 100 includes a tester 101 configured to perform a test routine including a plurality of test commands for testing an electronic circuit.

The tester 101 includes a checker 102 configured to, if a test command of the plurality of test commands is to be performed, check, whether there is currently a state in which performing the test command could lead to a damage of the electronic circuit and configured to, in case it determines that there is currently a state in which performing the test routine could lead to a damage of the electronic circuit, output a signal indicating that performing the test routine could lead to a damage of the electronic circuit.

In other words, according to one embodiment, a tester checks during execution of a test routine whether a test command would be executed in a state in which it might lead to a hazardous condition of the device under test, i.e. to a condition in which the device under test might be damaged. In case such an occurrence of a test command call is detected, a signal is output, e.g. causing stalling execution of the test command or at least causing a report about the hazardous condition. It should be noted that the test circuit may execute the test routine without the electronic circuit being connected to the test circuit (but instead simulating the hardware state) and a report may be generated based on the signal or signals (if any).

The tester may further include a controller configured to stall performing the test command in response to the signal.

The tester may further include a report generator configured to generate a report about the performing of the test routine and configured to include, in response to the signal, an indication into the report that a test command was to be performed in a state in which performing the test routine could have lead to a damage of the electronic circuit.

The state is for example a state of test circuit.

The test circuit for example includes a power instrument configured to generate test signals for the electronic circuit and a device interface board for interfacing the power instrument with the electronic circuit.

The state is for example a state of an arrangement including the test circuit and the electronic circuit. According to one embodiment, a test arrangement including the test circuit and the electronic circuit is provided.

The state is for example a state of a switch of the test circuit.

For example, the state is a state of one or more relays of the test circuit.

For example, the state includes whether a relay of the test circuit is open or closed.

The state may for example include whether a relay of the test circuit is in a settled state.

According to one embodiment, the checker is configured to check whether there is currently a state in which performing the test command could lead to a damage of the electronic circuit before performing the test command The plurality of test commands are for example those test commands among all test commands of the test routine that fulfill a predetermined criterion among all test commands of the test routine.

The components of the communication device (e.g. the tester, the checker, the controller etc.) may for example be implemented by one or more circuits. A "circuit" may be understood as any kind of a logic implementing entity, which may be special purpose circuitry or a processor executing software stored in a memory, firmware, or any combination thereof Thus a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit".

Figure 2:
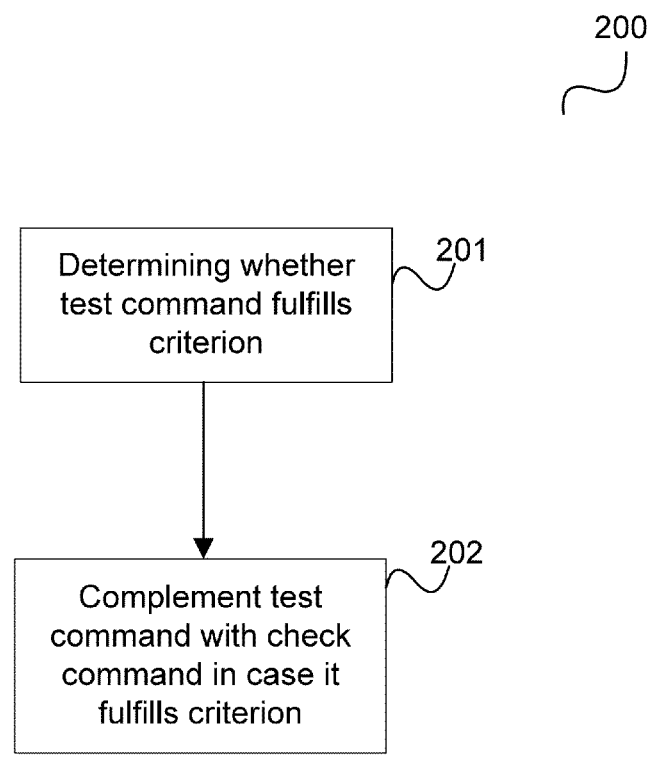
FIG. 2 shows a flow diagram.

A test routine may for example be processed as illustrated in FIG. 2.

FIG. 2 shows a flow diagram 200 according to an embodiment.

The flow diagram 200 illustrates a method for processing a test routine including a plurality of test commands for testing an electronic circuit.

In 201, it is determined, for each test command of the plurality of test commands, whether the test command fulfills a predetermined criterion.

In 202, each test command of the plurality of test commands that fulfills the predetermined criterion is complemented with a check command which checks whether performing the test command could lead to a damage of the electronic circuit and, in case it determines that there is currently a state in which performing the test routine could lead to a damage of the electronic circuit, outputs a signal indicating that performing the test routine could lead to a damage of the electronic circuit.

In other words, according to one embodiment, a test routine (e.g. a test program) is processed by adding to each call to certain test commands (e.g. test commands that may lead to hazardous conditions depending on the hardware state) a call to a checking procedure which checks whether there is a state (e.g. following from the execution of the test routine so far) that could lead to a damage of the electronic circuit.

Complementing the test command for example includes replacing a library including the test command with a library in which the test command is complemented with the check command The test command for example includes a control action and the complemented test command for example includes performing check before performing the control action.

The control action is for example opening or closing a switch, e.g. opening or closing a relay.

The predetermined criterion is for example that performing the test command may, in a certain state, lead do a damage of the electronic circuit.

It should be noted that embodiments described in context with the test circuit 100 are analogously valid for the method described with reference to FIG. 2 and vice versa.

In the following, an embodiment is described in more detail.

In the following example, a test program (test routine) is executed with a checker overlay. In this example, the checker checks for two hazardous state conditions, i.e. occurrences for a call to a test command in a state in which performing the test command leads to a hazardous condition.

Figure 3:
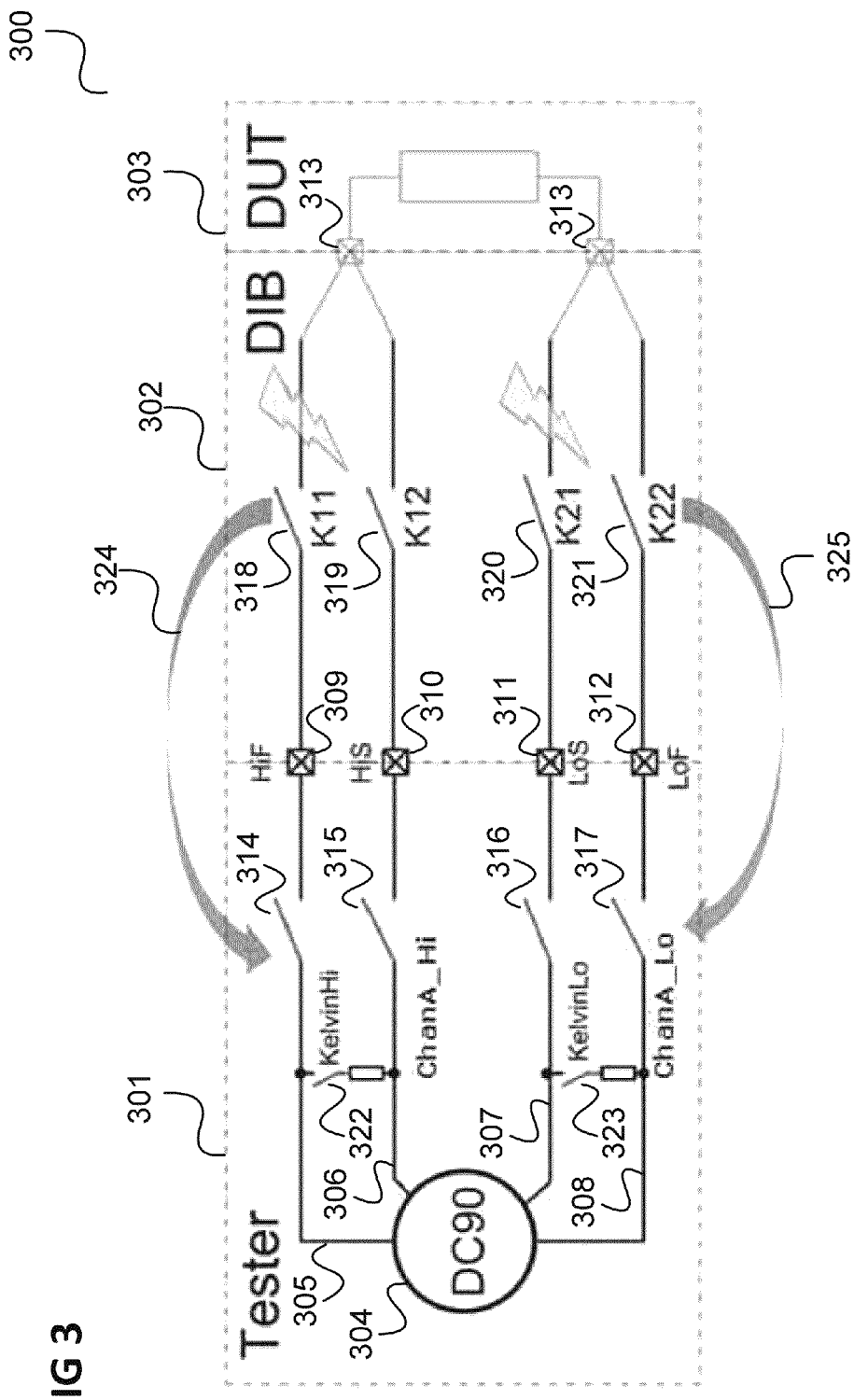
FIG. 3 shows a test arrangement.

The first hazardous condition for which the checker checks is illustrated in FIG. 3.

FIG. 3 shows a test arrangement 300.

The test arrangement 300 includes a tester 301, a device interface board 302 and a device under test 303.

The tester 301 includes a power instrument 304 providing test signals for testing the device under test 303. In this example, the tester instrument (tester) has two connection terminals (denoted as high channel and low channel) for connecting the device under test. For the high channel, it includes a first force line 305 and a first sense line 306. For the low channel, it includes a second force line 307 and a second sense line 308. The first force line 305 is connected via a first interface 309 to the DIB 302 and is continued on the DIB 302. The first sense line 306 is connected via a second interface 310 to the DIB 302 and is continued on the DIB 302. The second force line 307 is connected via a third interface 311 to the DIB 302 and is continued on the DIB 302. The second sense line 308 is connected via a fourth interface 312 to the DIB 302 and is continued on the DIB 302. The force and sense lines 305, 306, 307, 308 are coupled to the device under test 303 by the DIB 302 via contacts 313.

The first force line 305 may be interrupted within the tester 301 by a first tester relay 314. The first sense line 306 may be interrupted within the tester 301 by a second tester relay 315. The second force line 307 may be interrupted within the tester 301 by a third tester relay 316. The second sense line 308 may be interrupted within the tester 301 by a fourth tester relay 317.

The first force line 305 may be interrupted within the DIB 302 by a first DIB relay 318. The first sense line 306 may be interrupted within the DIB 302 by a second DIB relay 319. The second force line 307 may be interrupted within the DIB 302 by a third DIB relay 320. The second sense line 308 may be interrupted within the DIB 302 by a fourth DIB relay 321.

Additionally, the first force line 305 and the first sense line 306 may be connected by a first channel connection relay (also denoted as local Kelvin relay) 322 and the second force line 307 and the second sense line 308 may be connected by a second channel connection relay 323.

As a first HSC, the checker checks whether, in case a DIB relay 318, 319, 320, 321 is switched (i.e. in case there is a test command to switch the DIB relay), its associated tester relay 314, 315, 316, 317 (i.e. the tester relay for interrupting the same force or sense line 305, 306, 307, 308) is closed and the associated channel connection relay (i.e. the one for connecting the force or sense line which may be interrupted with the DIB relay to the force or sense line of the same channel) is open. Namely, this can be seen as an open loop condition which may damage the device under test 303.

The test commands which when performed may damage the device under test 303 are in this case for example
  A command to close a DIB relay,
    e.g. the command
      "TheHdw.Utility.Pins("PinList").state"
    in the example of a IGXL based test routine.
  A command to reset a DIB relay to its default value (which may be "closed"),
    e.g. the command
      "TheHdw.Utiliy.Reset"
    in the example of a IGXL based test routine.

The checker for example checks, for each occurrence of any of the above two commands, whether the occurrence (e.g. a call) of the test command within the test routine is made in the state that the tester relay associated with the DIB relay is closed and the channel connection relay associated with the DIB relay is open. This checking is illustrated by arrows 324, 325. If the check is positive, the checker may trigger (e.g. by means of a signal) a break in the test routine execution and/or a corresponding entry in a report.

It should be noted that the checker only detects a HSC in this case when a DIB relay is switched. In case a DIB relay does not change its switching state nothing is detected for this HSC.

Figure 4:
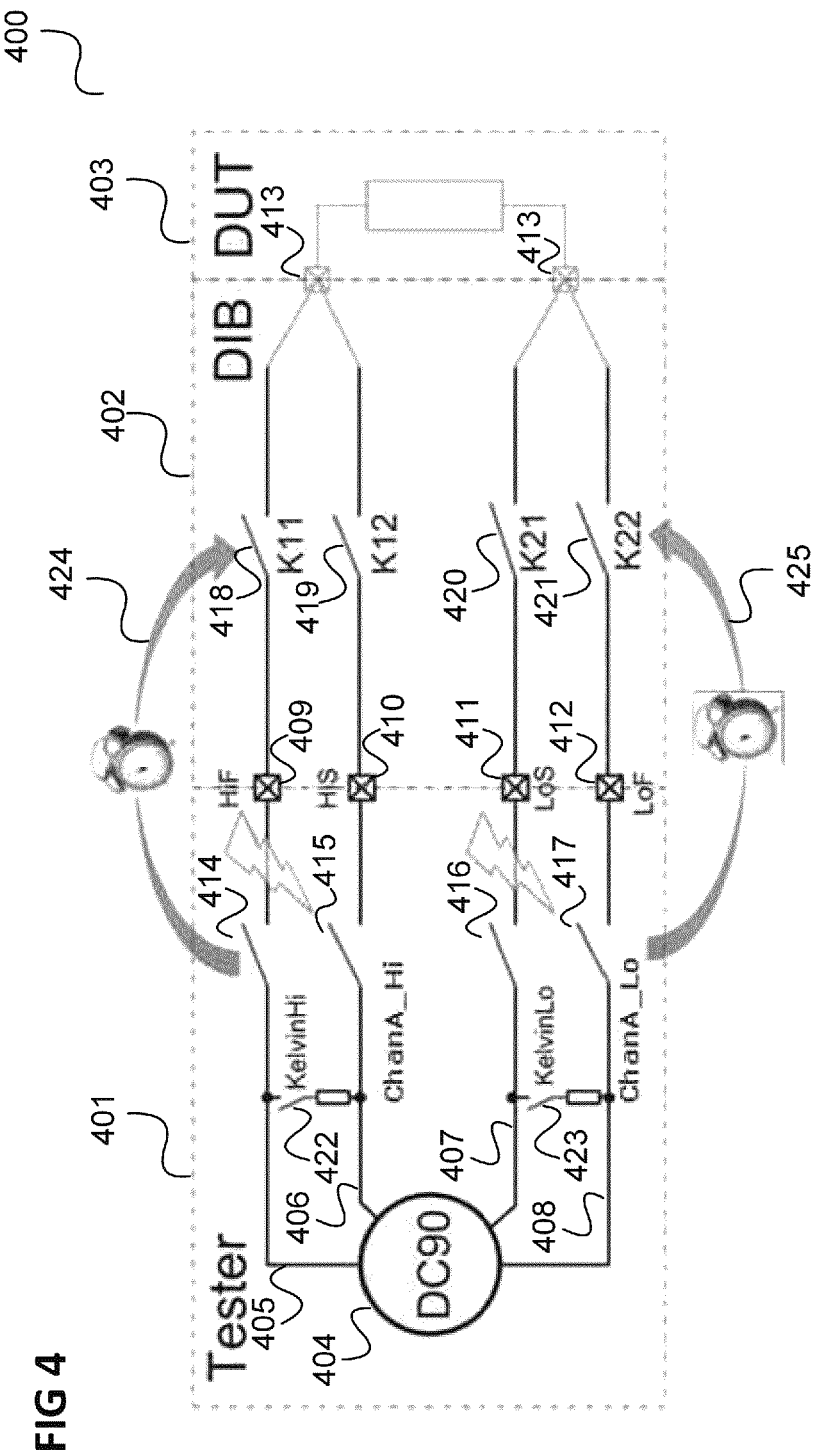
FIG. 4 shows a test arrangement.

The second hazardous condition for which the checker checks is illustrated in FIG. 4.

FIG. 4 shows a test arrangement 400.

The test arrangement 400 includes a tester 401, a device interface board 402 and a device under test 403 which include a power instrument 404, force lines and sense lines 405 to 408, interfaces 409 to 412, contacts 413 and relays 414 to 423 as explained above with reference to FIG. 3.

As the second HSC, the checker checks whether a tester relay 414, 415, 416, 417 is closed when its associated DIB relay 418, 419, 420, 421 has not settled (this can be seen as bouncing condition).

The test command which when performed may damage the device under test 403 is in this case for example a command to close a tester relay (i.e. a command to connect the power instrument 404 to the DIB 402), e.g. the command "TheHdw.DCVI.Pins("PinList").connect" in the example of a IGXL based test routine.

The checker for example checks, for each occurrence of the above command, whether the occurrence (e.g. a call) of the test command within the test routine is made in the state that the DIB relay associated with the tester relay has not yet settled (e.g. that a predetermined settling time has not yet elapsed after switching the DIB relay). This checking is illustrated by arrows 424, 425. If the check is positive, the checker may trigger (e.g. by means of a signal) a break in the test routine execution or a corresponding entry in a report.

In case the checker detects an HSC, it may further trigger a synchronization pulse to an oscilloscope connected to the test arrangement 300, 400 via a corresponding output, e.g. immediately before the occurrence takes effect, e.g. the hazardous condition occurs.

In the following, an example is given how the checker functionalities may be implemented into a given test routine which is in this example assumed to be based on the Teradyne IGXL programming language.

The Teradyne IGXL programming language is based on a class-oriented extension of the Microsoft Visual Basic (VBA) environment of Excel. This extension is divided into two parts, the program execution control, denoted as TheExec and the hardware control denoted as the TheHdw. The variables TheExec and TheHdw are instantiated objects which are defined in a tester specific library. To enable a test routine to use these variables, a corresponding reference (in other words a library) is provided by Teradyne.

In Microsoft Visual Basic references or libraries that are used and made available for a current project (e.g. a program, in this case the test program) may be given priorities by defining a ranking or an order of the references such that the reference that comes first has the highest priority among the references. The current project (the test program in this case) has an even higher priority. In case a data structure or a function which is not defined in the test program but which is referred to in the test program, the definition is taken from the highest-ranked reference that includes a definition for the data structure or function.

Figure 5:
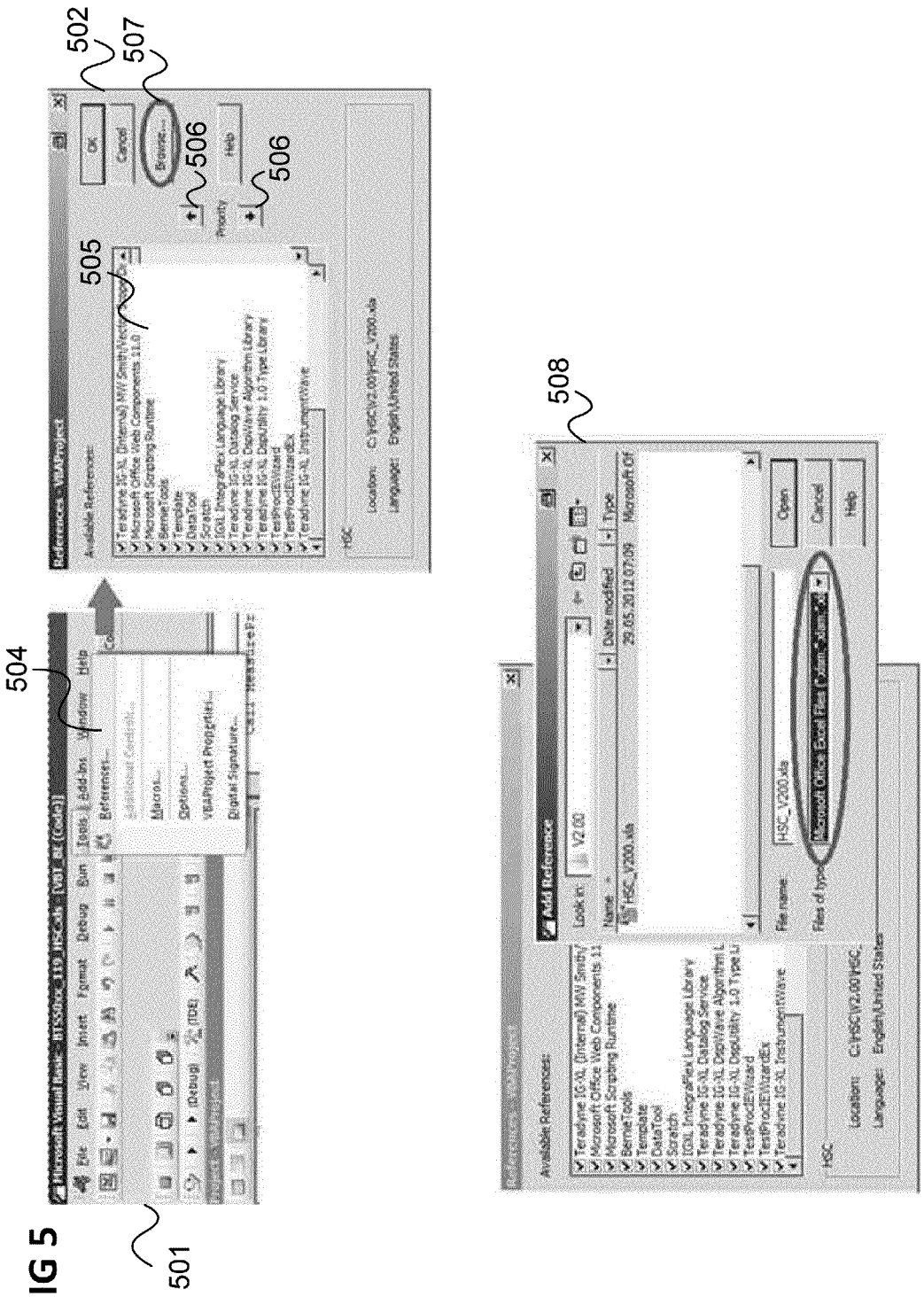
FIG. 5 shows Excel program windows.

The adding of a reference in the Microsoft Visual Basic (VBA) environment of Excel is illustrated in FIG. 5.

FIG. 5 shows Excel program windows.

In this example, it is assumed that a user adds a checker library denoted as "HSC-V2xx.xla" as reference to his test program to add the checker functionalities to the test program.

A first program window 501 is the visual basic editor window of Excel. By selecting Reference 504 in the submenu Tools the user may trigger display of a reference window 502. Here, all the references that are available for the current project are shown in a list 505 and by highlighting a reference clicking on arrows 506 the user may change the position of the highlighted reference within the list and thus change its priority.

By clicking on a Browse button 507 the user can browse for a library to be added. Accordingly, a browse window 508 is opened which, for example, allows the user to add the library "HSC-V2xx.xla" (e.g. from a certain directory where the user has stored the library) as reference to his test program.

The concept of references with priorities allows that a data structure or a function is declared multiple times wherein the definition that is used by the test program is the one in the library with the highest priority (that has a definition for the data structure or function) unless the current project includes a definition itself.

For example, let a global variable x be defined in the current project and assume that this variable is also defined in the highest-ranked library. If this variable is accessed in the test program, the variable as defined in the test program is used. Only if the variable x in the test program is renamed or deleted the variable x as defined in the next highest ranked library is used. This for example applies to the variables TheHdw and TheExec.

The variables TheHdw and TheExec are defined in the module (or library) Template. By defining them in a library which is set to a higher rank than the library template, the test program interface may be changed. According to one embodiment, an overlay interface is introduced which may forward user input to the original test program interface but which further allows including various checks during the test program execution.

The approach of replacing variables in this way may in principle be applied to any variable. In the following example, it is applied to the variable TheHdw.

The variable TheHdw is an object which allows a structured level-oriented programming. For example, for addressing a resource (e.g. a function or a data structure), this resource needs to be addressed starting from the first level (level 0). Depending on the level, there a are more or less methods and functions. The structure of TheHdw is illustrated in FIG. 6.

Figure 6:
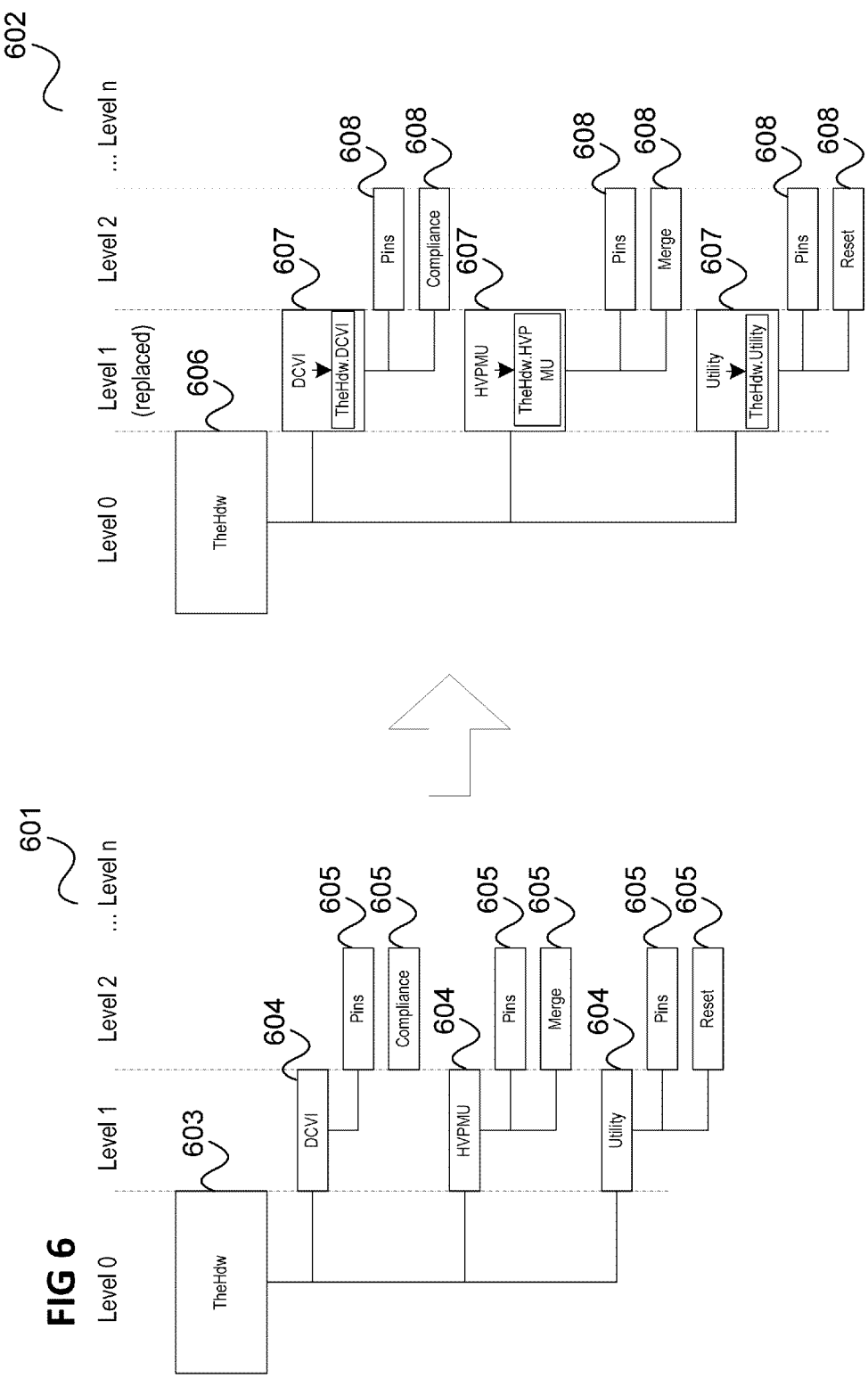
FIG. 6 shows a first object structure and a second object structure.

FIG. 6 shows a first object structure 601 and a second object structure 602.

The first object structure 601 is in this example the object TheHdw as provided by Teradyne to be used for a test program. It includes a root object 603 on a first level, second level objects 604 and third level objects 605. Further levels may include further objects but are not shown here for simplicity.

By defining an object in a library that is set to a higher rank than the library including the definition of the original TheHdw 601, the objects 603, 604, 605 may be at least partially replaced.

For example, the second object structure 602 is the variable TheHdw as it arises when a higher ranked library than the library that contains the original TheHdw contains replacement definitions for at least a part of the objects 603, 604, 605.

For example, by replacing the first level object 603 with a first level replacement object 606 the test program overlay may be introduced. The second level objects 604 are completely copied by second level replacement objects 607 such that the functionality which is provided by the second level objects 604 are available for the test program when run from the overlay. The second level replacement objects 607 may refer to third level replacement objects 608 which may be the same as the third level objects 605 (i.e. the second level replacement objects 607 may refer to the original third level objects 605). However, certain functionalities may require that objects on the third level or even on deeper levels in the tree structure are replaced.

When the checker functionality (e.g. the overlay) is installed, all calls from the test program run through the first level replacement object 606. Besides introducing the user interface overlay by replacing the first level object 603, the checks for HSCs as described above may be introduced. For example, the object which contains the definition of one of test commands as described above (e.g. the command TheHdw.Utility.Pins("PinList").state) is replaced such that the call of the test command includes a call to a check function which checks whether the tester relay associated with the DIB relay for which the command is called is closed and the channel connection relay associated with the DIB relay is open. For the actual functionalities of the test command, the replacement object may refer to the original definitions for the test command (e.g. of sub-procedures called by the test command which are for example defined in deeper levels).

Figure 7:
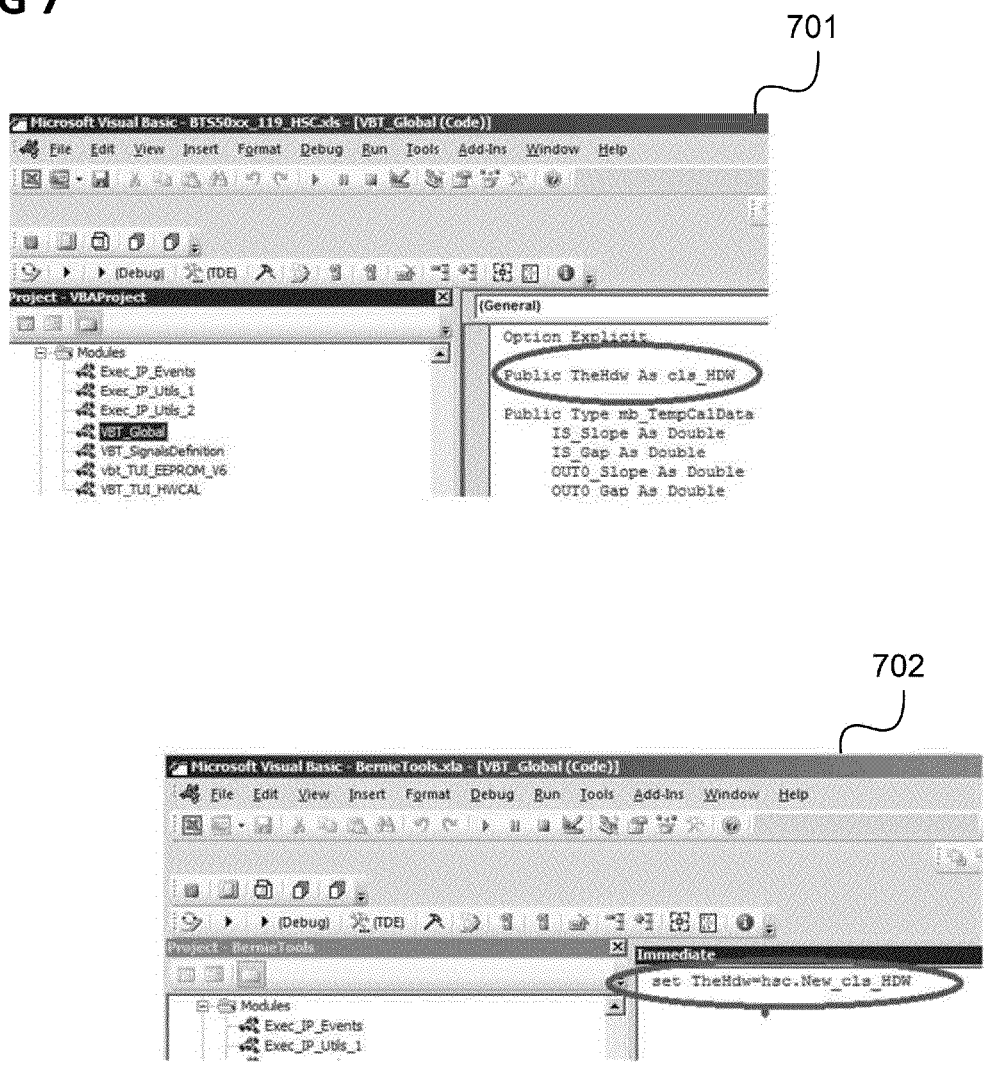
FIG. 7 shows Excel screens.

In one exemplary implementation, the user declares the public variable TheHdw in the test program and instantiates TheHdw. This is illustrated in FIG. 7. It should be noted that in one embodiment, this declaration is not required. A library (e.g. "HSCxx.xla") may be provided that automatically provides the replacement object TheHdw as the highest ranking object definition by instancing the object (e.g. HSC.New_cls_Hdw). In addition the instancing of the object triggers a scan for other AddIn Libraries and attaches to them respectively with highest ranking.

FIG. 7 shows Excel screens 701, 702.

In the first Excel screen 701, the visual basic editor window of Excel is shown. On the module layer, the user may declare the public variable TheHdw by "Public TheHdw as cls_Hdw". This approach may be used since in this example the checker functionalities are included in an XLA (Excel Add-In) which does not allow the direct creation of objects.

The user may than instantiate TheHdw by using the immediate pane of the visual basic editor as shown in the second Excel screen 702 and entering the command "Set TheHdw=HSC.New_cls_Hdw". This statement can alternatively be used anywhere in the test program. However, each execution of this statement creates a new instance of TheHdw. For deinstallation of the checker overlay, the user can remove the declaration of TheHdw from the test program and remove the reference (e.g. uncheck it) from the references for the test program.

Figure 8:
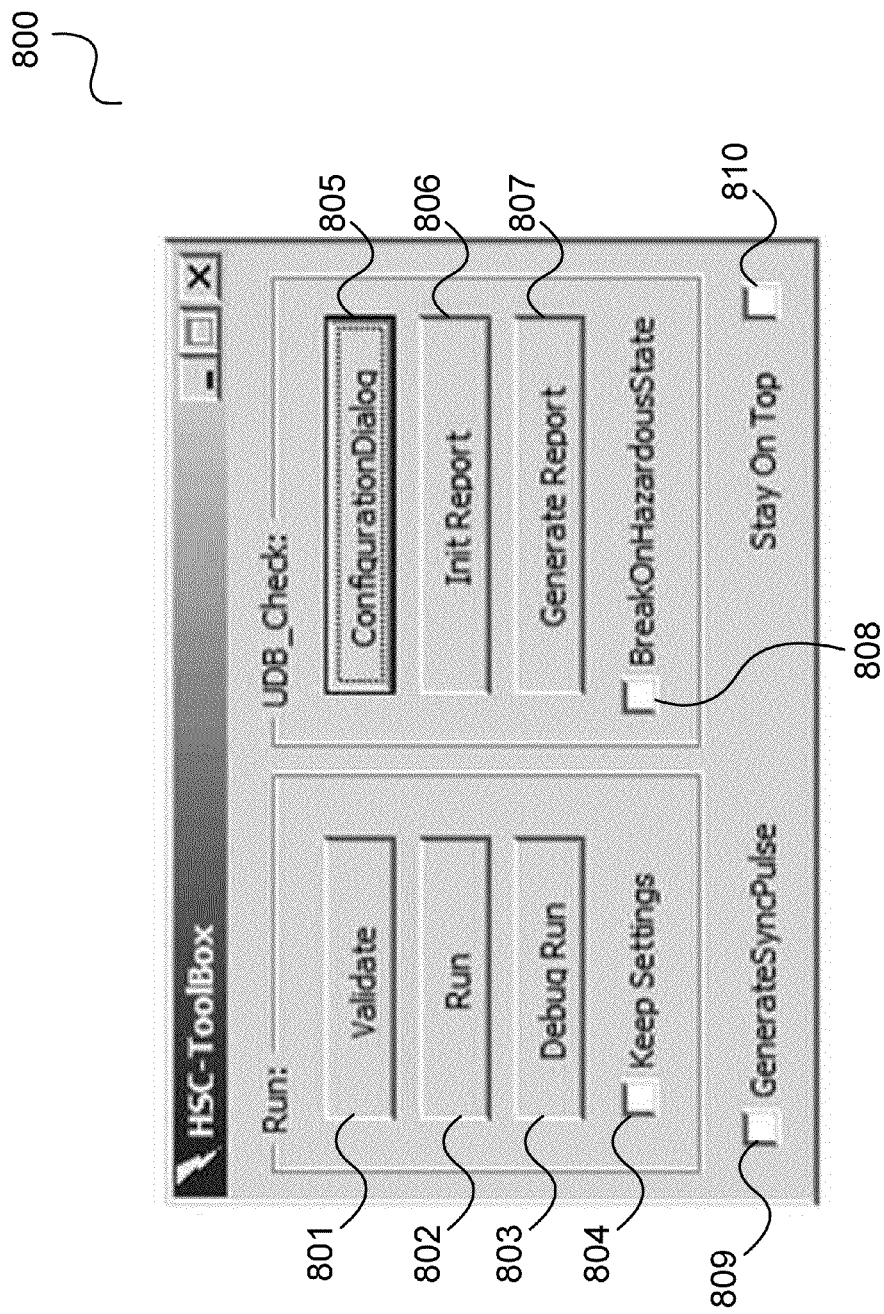
FIG. 8 shows a user interface.

After creating an instance of TheHdw (in its replaced version) the overlay user interface is displayed as shown in FIG. 8.

FIG. 8 shows a user interface 800.

The user interface 800 has, under a part labeled "Run", a button "Validate" 801 for forcing validation of the test program, a button "Run" 802 for running the test program, a button "Debug Run" 803 for Running the test program in debug mode and a check box "Keep Settings" 804 for switching on/off the keeping of the settings as done by the user in the user interface 800.

Further, the user interface 800 has, under as part labeled "UDB-Check", a button "Configuration Dialog" 805 for showing the configuration dialog described below with reference to FIG. 8, an "Init Report" button 806 for initializing for the report run, a "Generate Report" button 807 for generating the report and a "BreakonHazardousState" check box 808 for switching on/off the functionality that the test program execution is halted in case a HSC is detected.

Further, the user interface 800 has a "GenerateSyncPulse" check box 809 for switching on/off the creation of a trigger pulse for an oscilloscope and a "Stay on Top" check box 810 for switching on/off that the user interface 800 always stays on top of the screen.

Figure 9:
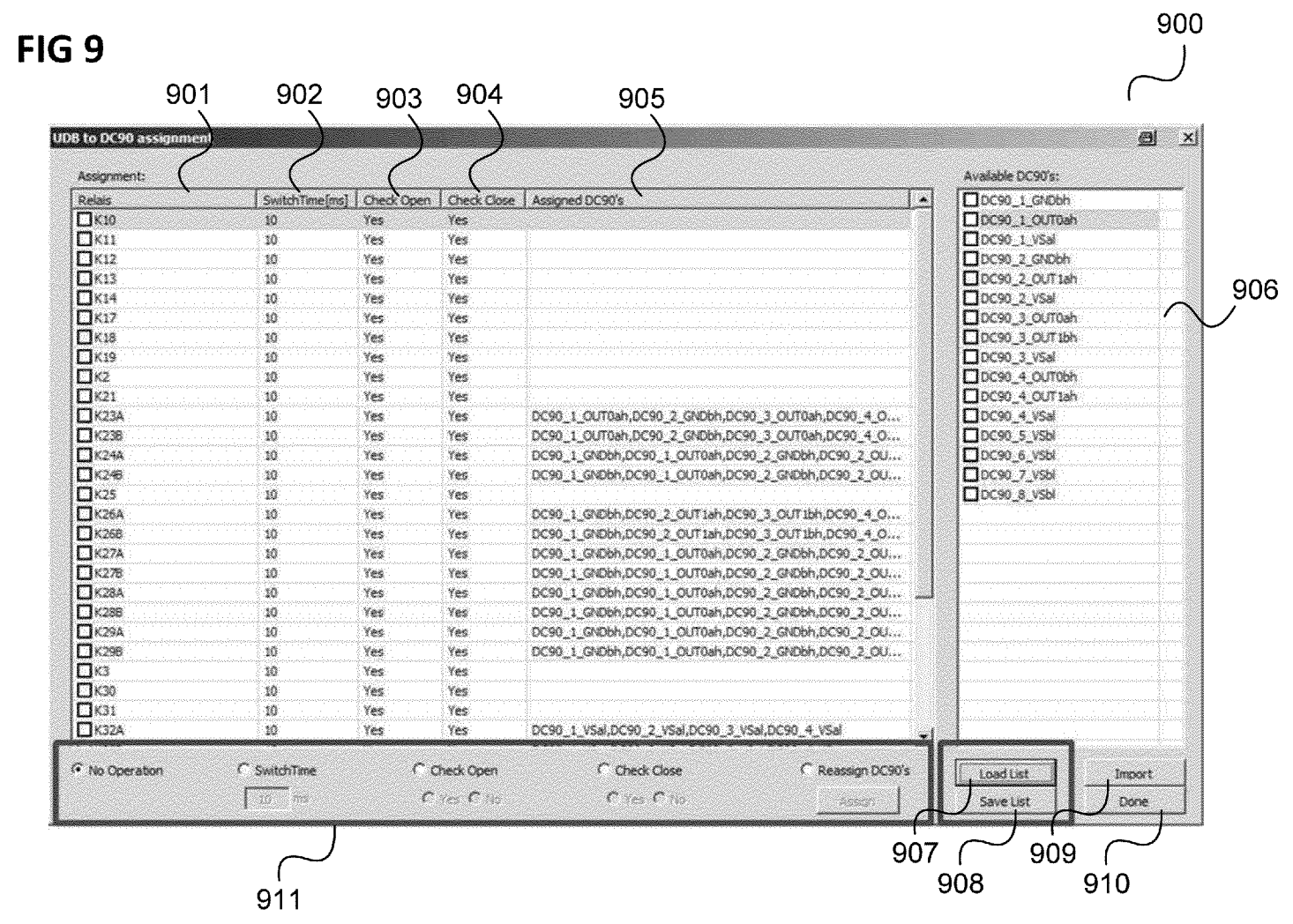

The configuration dialog is illustrated in FIG. 9.

FIG. 9 shows an option screen 900.

The option screen 900 includes a table which has in a first column 901 a list of relays used by the test program, in a second column 902 the required settle times defined for the relays, in a third column 903 a specification whether the state of the power instrument assigned with the relay is checked when the relay gets opened, in a fourth column 904 a specification whether the state of the power instrument assigned with the relay is checked when the relay gets closed and in a fifth column the power instruments assigned to the relays (assuming that the DIB is connected to a plurality of power instruments). Available power instruments are given in a list 906.

In the first column 901, there is a checkbox for each relay allowing selection of the relay. Buttons 907, 908, 909, 910 allow loading, saving, importing and exiting the configuration dialog.

A part 911 of the configuration dialog allows selecting operation modes for the selected relay(s) which will be described in the following.

No Operation (view only): In case of multiple checked relays, the available power instruments for the first relay is shown in the list 906. Arrow Up/Down Keys can be used to select a single relay for which then the assigned power instruments are shown list 906.

SwitchTime: The SwitchTime of the selected relay can be changed by the value applied in the field below the check box "SwitchTime".

CheckOpen: Selected relays can be configured to be scanned or not when released (opened).

CheckClose: Selected relays can be configured to be scanned or not once getting active (closed).

Reassign DC90's: Power instruments (DC90s) can be selected in the list 906 and (re)assigned to the selected relay by pressing the "Assign" button.

The functionality of the "Init Report" button 806, the "Generate Report" button 807 and the "BreakonHazardousState" check box 808 for example includes the following.

InitForReport: Cleanup of the HSC Occurrence List; Reset of the Relay's SwitchCount; Reset of the Program Execution Count.

GenerateReport: Generates a file which contains information about the Testcell, RunMode, Module Configuration and any Occurrence of a HSC (if found). This report may be used for documentation of the test program regarding HSCs.

BreakOnHazardousState: Popup of a message which allows going to the corresponding line of code in the test program once an HSC occurrence has been detected. It should however be noted that a debug break may cause a potential risk to harm the DUT, DIB and/or tester instruments In case of the HSCs being as described above, the conditions for a break on hazardous state are:

If a DIB relay 318, 319, 320, 321 is switched, its associated tester relay 314, 315, 316, 317 is closed and the associated channel connection relay is open (also referred to as LocalKelvin Condition, referred to as first HSC above).

If a relay settle time violation has been detected (referred to as second HSC above)

In both cases, for example, upon a break, pressing ESC allows the user to continue to the next occurrence, pressing Enter or a button allows the user to go to the line of code of the test program where the occurrence has happened. A check box "BreakOnHazardousState" in the popup can for example be used by the user to continue the test program without further breaks.

Regarding the settle time violation, the following should be noted. Whenever a DIB relay gets switched its time stamp get updated according to one embodiment.

Whenever a tester relay gets switched it is checked whether there is a settle time violation of the associated DIB relay. However, this scan (i.e. check) costs some time which would not consumed in normal execution of the test program. One possibility to take this into account is to measure the required time for the scan and readjust the time stamps of all the relays. However, this correction of the time stamps may results in a time domain violation which gets visible once another time domain is used in parallel. (e.g. in settle wait - dynamic wait technique). Therefore, according to one embodiment, two time stamps are implemented. One measures the absolute timing and the other measures the corrected (adjusted) timing. A settle time violation is present once the absolute timing is violated.

In the following, an example for a report that may be generated using the "Generate Report" button 807 is described.

According to its basic structure, the report includes
a header having information about the used test program and environment
a module configuration section including information about the status of the Switches (relays)
a used resource assignment section including the relay to power instrument assignment which has been used for the report
a section including the hazardous condition occurrences detected (a warning message may pop up in case such an occurrence has been detected).

An example for a report header is shown in FIG. 10.

FIG. 10 shows a report header 1000 according to an embodiment.

The header includes checker and version information, the name of the module providing the report, and information about the date, time and the user 1003.

In a section including details about the test program and execution information 1004, the header 1000 includes site information 1005 and the number of runs since the last validation sequence or the report initialization.

In a computer information section 1006, the header 1000 includes details about the computer running the test program.

In an IGXL information section, the header 1000 includes details about the IGXL software version used.

An example for a module configuration section is given in FIG. 11.

FIG. 11 shows a module configuration section 1100 according to an embodiment.

The module configuration section 1100 includes information 1101 showing the status of the option BreakOnHazardousState. Further, it includes the information from the table of the configuration dialog as described above. It should be noted that a settling time is only shown for a relay that has a power instrument assignment. Compared to the table of the configuration dialog described with reference to FIG. 9, the module configuration in this example additionally includes a column 1102 with a switch count for each relay which gets increased by every open or close command to the relay.

An example for a header section including the hazardous condition occurrences detected is shown in FIG. 12.

FIG. 12 shows an occurrences section 1200 according to one embodiment.

The occurrences section 1200 includes a first section 1201 for absolute relay settling time violation, a second section 1202 for adjusted (corrected) relay settling time violation, a third section 1203 for the first HSC described above and a fourth section 1204 for adjusted (corrected) relay settling time violation (similar to the second section 1202).

The first section 1201, the second section 1202 and the fourth section 1204 include timing information. The third section 1203 shows the connection state of the respective relays.

Figure 13:
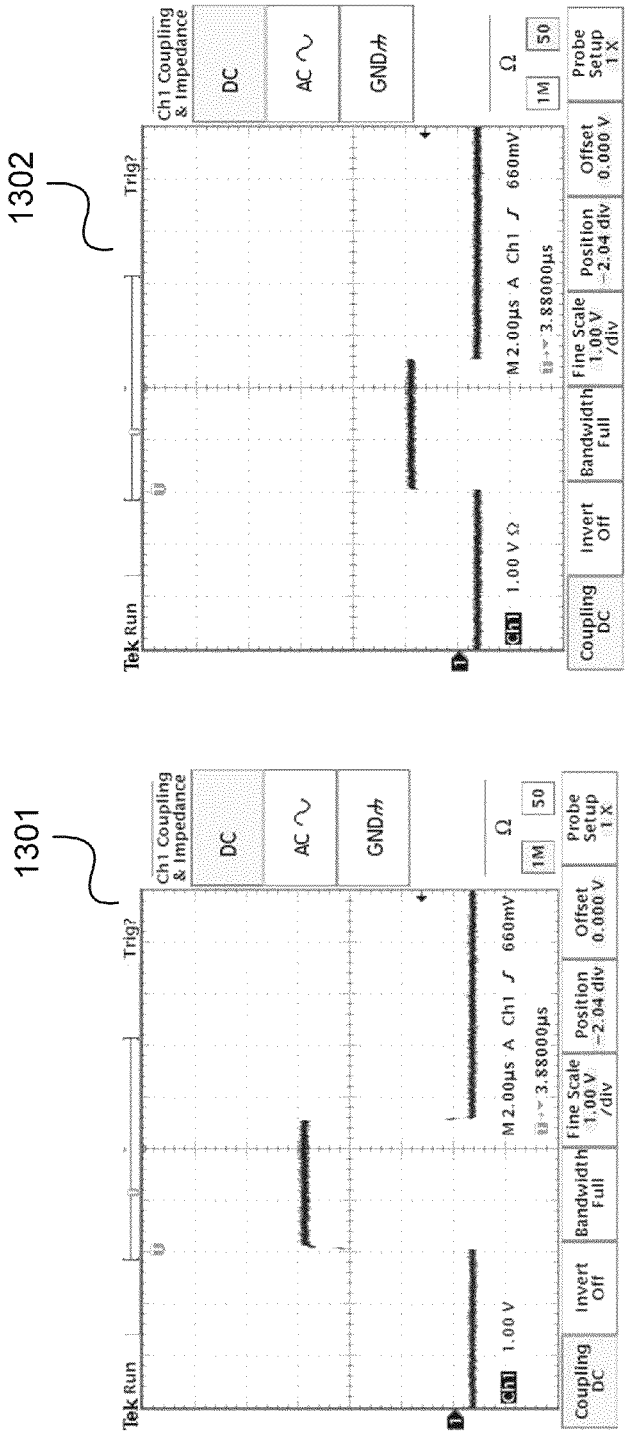
FIG. 13 shows oscilloscope outputs.

FIG. 13 shows oscilloscope outputs 1301, 1302.

The oscilloscope outputs 1301, 1302 illustrate synchronization pluses that may be output by the checker overlay upon occurrence of a hazardous condition in order to trigger an oscilloscope.

FIG. 14 shows oscilloscope outputs 1401, 1402.

The oscilloscope outputs 1401, 1402 (at different time scales) illustrate a behavior with various voltage spikes during a relay switching.

Figure 15:
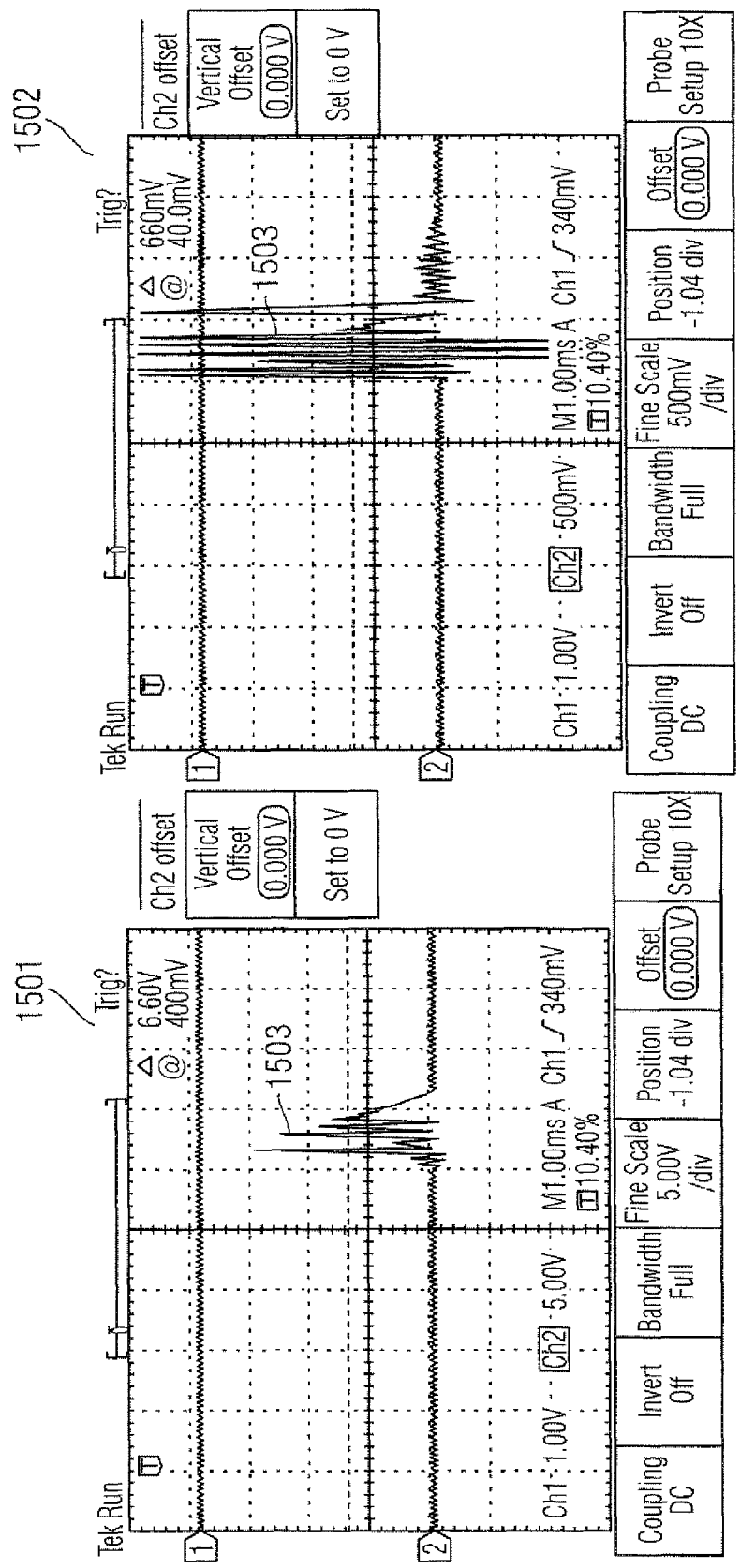
FIG. 15 shows oscilloscope outputs.

FIG. 15 shows oscilloscope outputs 1501, 1502.

The oscilloscope outputs 1501, 1502 (at different voltage scales) a voltage spike 1503 caused by a hazardous condition that occurs in a test program.

Such a voltage spike may cause damage to the device under test. By detecting the hazardous condition this may be avoided.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A test circuit comprising:
 a tester configured to perform a test routine comprising a plurality of test commands for testing an electronic circuit, wherein the tester comprises a checker configured to, for each of the plurality of test commands to be performed, check prior to each performance of the test command, whether there is currently a state in which performing the test command could lead to a damage of the electronic circuit and configured to, in case it determines that there is currently a state in which performing the test routine could lead to a damage of the electronic circuit, output a signal indicating that performing the test routine could lead to a damage of the electronic circuit.

2. The test circuit according to claim 1, wherein the tester further comprises a controller configured to stall performing the test command in response to the signal.

3. The test circuit according to claim 1, wherein the tester further comprises a report generator configured to generate a report about the performing of the test routine and configured to include, in response to the signal, an indication into the report that a test command was to be performed in a state in which performing the test routine could have lead to a damage of the electronic circuit.

4. The test circuit according to claim 1, wherein the state is a state of test circuit.

5. The test circuit according to claim 1, wherein the test circuit comprises a power instrument configured to generate test signals for the electronic circuit and a device interface board for interfacing the power instrument with the electronic circuit.

6. The test circuit according to claim 1, wherein the state is a state of an arrangement comprising the test circuit and the electronic circuit.

7. The test circuit according to claim 1, wherein the state is a state of a switch of the test circuit.

8. The test circuit according to claim 1, wherein the state is a state of one or more relays of the test circuit.

9. The test circuit according to claim 8, wherein the state includes whether a relay of the test circuit is open or closed.

10. The test circuit according to claim 8, wherein the state includes whether a relay of the test circuit is in a settled state.

11. The test circuit according to claim 1, wherein the checker is configured to check whether there is currently a state in which performing the test command could lead to a damage of the electronic circuit before performing the test command.

12. The test circuit according to claim 1, wherein the plurality of test commands are those test commands among all test commands of the test routine that fulfill a predetermined criterion among all test commands of the test routine.

13. Method for processing a test routine comprising a plurality of test commands for testing an electronic circuit, the method comprising: determining, for each test command of the plurality of test commands, whether the test command fulfills a predetermined criterion; and complementing each test command of the plurality of test commands that fulfills the predetermined criterion with a check command which checks prior to each performance of the test command, whether performing the test command could lead to a damage of the electronic circuit and, in case it determines that there is currently a state in which performing the test routine could lead to a damage of the electronic circuit, outputs a signal indicating that performing the test routine could lead to a damage of the electronic circuit.

14. The method according to claim 13, wherein complementing the test command comprises replacing a library including the test command with a library in which the test command is complemented with the check command.

15. The method according to claim 13, wherein the test command includes a control action and the complemented test command includes performing check before performing the control action.

16. The method according to claim 15, wherein the control action is opening or closing a switch.

17. The method according to claim 15, wherein the control action is opening or closing a relay.

18. The method according to claim 13, wherein the predetermined criterion is that performing the test command may, in a certain state, lead do a damage of the electronic circuit.

* * * * *